(12) United States Patent
Binner

(10) Patent No.: US 10,070,545 B2
(45) Date of Patent: Sep. 4, 2018

(54) ELECTRICAL DEVICE

(71) Applicant: WAGO Verwaltungsgesellschaft mbH, Minden (DE)

(72) Inventor: Lars Binner, Melle (DE)

(73) Assignee: WAGO VERWALTUNGSGESELLSCHAFT MBH, Minden (DE)

( * ) Notice: Subject to any disclaimer, the term of this patent is extended or adjusted under 35 U.S.C. 154(b) by 492 days.

(21) Appl. No.: 14/633,954

(22) Filed: Feb. 27, 2015

(65) Prior Publication Data

US 2015/0245507 A1 Aug. 27, 2015

(30) Foreign Application Priority Data

Feb. 27, 2014 (DE) .................... 20 2014 100 895 U

(51) Int. Cl.
  *H05K 7/02* (2006.01)
  *H05K 5/02* (2006.01)
  *G06K 7/00* (2006.01)
  *G06K 13/08* (2006.01)

(52) U.S. Cl.
  CPC ......... *H05K 5/0217* (2013.01); *G06K 7/0013* (2013.01); *G06K 7/0056* (2013.01); *G06K 13/085* (2013.01)

(58) Field of Classification Search
  CPC .. G06K 13/085; G06K 7/0013; G06K 7/0056; H05K 5/0217
  USPC .......................................... 174/541
  See application file for complete search history.

(56) References Cited

U.S. PATENT DOCUMENTS

| 4,727,244 | A | 2/1988 | Nakano et al. | |
| 5,120,946 | A * | 6/1992 | Hug | G06K 7/0021 235/441 |
| 6,974,338 | B1 * | 12/2005 | Hasegawa | G06K 13/08 439/159 |
| 8,556,168 | B1 | 10/2013 | Lewis et al. | |
| 2002/0050516 | A1 * | 5/2002 | Kitchen | G06K 13/08 235/441 |

(Continued)

FOREIGN PATENT DOCUMENTS

| DE | 197 38 412 A1 | 3/1999 |
| DE | 198 15 401 A1 | 10/1999 |

(Continued)

*Primary Examiner* — Timothy Thompson
*Assistant Examiner* — Rhadames J Alonzo Miller
(74) *Attorney, Agent, or Firm* — Renner Otto Boisselle and Sklar

(57) ABSTRACT

The invention relates to an electrical device (1) having a housing (2) and at least one receiving shaft (3), which is accessible from an outer side of the housing (2), for an electronic data storage means (4) which can be inserted into the receiving shaft (3) and, as a result, can make contact with electrical components arranged in the electrical device (1) and optionally can be removed again from the receiving shaft (3), wherein the receiving shaft (3) is surrounded at least partially by a recessed grip (5) on the outer side of the housing (2), which recessed grip is designed as a depression with respect to the outer contour of the housing (2), wherein at least one light exit opening (9) for light output by at least one electric light source (10) of the electrical device (1) is arranged within the recessed grip (5).

16 Claims, 5 Drawing Sheets

(56) References Cited

U.S. PATENT DOCUMENTS

| | | | |
|---|---|---|---|
| 2002/0079373 A1* | 6/2002 | Oki | G06K 13/08 235/475 |
| 2002/0094726 A1* | 7/2002 | Akagi | G06K 13/085 439/630 |
| 2003/0117783 A1* | 6/2003 | Maruyama | G06K 7/00 361/759 |
| 2003/0195020 A1* | 10/2003 | Kubo | H04B 1/3816 455/575.1 |
| 2004/0007620 A1* | 1/2004 | Hirasawa | G06K 13/08 235/449 |
| 2004/0079806 A1* | 4/2004 | Ogushi | G06K 13/06 235/483 |
| 2005/0112927 A1* | 5/2005 | Wang | G06K 7/0013 439/326 |
| 2005/0208805 A1* | 9/2005 | Kodera | G06K 13/08 439/159 |
| 2005/0255730 A1* | 11/2005 | Oh | G06K 13/08 439/160 |
| 2006/0086793 A1* | 4/2006 | Oguchi | G06K 13/08 235/441 |
| 2006/0219785 A1* | 10/2006 | Sato | G06K 7/0043 235/441 |
| 2006/0283946 A1* | 12/2006 | Riester | G06K 13/08 235/441 |
| 2007/0134965 A1* | 6/2007 | Takai | G06K 7/0034 439/260 |
| 2007/0243733 A1* | 10/2007 | Gu | G06K 13/085 439/131 |
| 2008/0090446 A1* | 4/2008 | Lamont | G06F 1/1656 439/351 |
| 2008/0158583 A1* | 7/2008 | Yomogida | G03G 15/5066 358/1.13 |
| 2009/0063743 A1* | 3/2009 | Aoki | G06K 13/085 710/302 |
| 2009/0172235 A1* | 7/2009 | Yan | G06K 19/07 710/302 |
| 2010/0051487 A1* | 3/2010 | Sheba | A45C 11/18 206/307 |
| 2010/0051697 A1* | 3/2010 | Long | G06K 13/085 235/486 |
| 2010/0085716 A1* | 4/2010 | Long | G06K 13/08 361/748 |
| 2010/0093200 A1* | 4/2010 | Ye | H01R 13/635 439/159 |
| 2013/0050964 A1* | 2/2013 | Kume | G06K 13/085 361/754 |
| 2013/0063910 A1* | 3/2013 | Chao | G06F 1/1656 361/754 |
| 2013/0094162 A1* | 4/2013 | Tang | G06K 13/085 361/754 |
| 2013/0258576 A1* | 10/2013 | Ben-Gad | G06K 13/0806 361/679.32 |
| 2013/0260612 A1* | 10/2013 | Sherry | G06K 7/0021 439/630 |
| 2014/0199875 A1* | 7/2014 | Choi | H04B 1/3816 439/346 |

FOREIGN PATENT DOCUMENTS

| | | |
|---|---|---|
| DE | 601 23 469 T2 | 8/2007 |
| EP | 0313882 | 5/1989 |
| EP | 1347406 | 9/2003 |

* cited by examiner

ELECTRICAL DEVICE

This application claims priority of German Application No. DE 20 2014 100.895.0 filed Feb. 27, 2014, which is hereby incorporated herein by reference.

The invention relates to an electrical device having a housing and at least one receiving duct, which is accessible from an outer side of the housing, for an electronic data storage means as claimed in claim 1.

A data card arrangement in a device follows from EP 0 313 882 A2, in which device a plurality of data cards are used at the same time. In this connection, a data card receiver is present, which data card receiver is designed to receive two data cards.

In contrast thereto, the invention is based on the object of specifying an electrical device with improved functionality.

The stated object is achieved as claimed in claim 1 by an electrical device having a housing and at least one receiving duct, which is accessible from an outer side of the housing, for an electronic data storage means which can be inserted into the receiving duct and, as a result, can make contact with electrical components arranged in the electrical device and optionally can be removed again from the receiving duct, wherein the receiving duct is surrounded at least partially by a grip cavity on the outer side of the housing, which grip cavity is designed as a hollow recess with respect to the outer contour of the housing, wherein at least one light exit opening for light output by at least one electric light source of the electrical device is arranged within the grip cavity.

The invention has the advantage that, by arranging at least one light exit opening within the grip cavity, light signals can be generated in the region of the grip cavity, which light signals, owing to their spatial proximity to an electronic data storage means inserted into the receiving duct, can be intuitively easily associated with said data storage means by a user. A connection is intuitively made between the light signals of the electric light source which are emerging from the light exit opening and a particular functional state of the electronic data storage means. Another advantage of the invention is that, owing to the arrangement of the light exit opening within the grip cavity, space is saved on the remaining outer surface of the housing of the electrical device and the light exit opening can be accommodated in a compact manner.

The electrical device can be any device which is electrically operated in any way, for example an electronic device. The electrical device can be, for example, an open-loop and/or closed-loop control device, for example for automated controllers, for example for automation technology. The electronic data storage means can likewise be designed as data storage means of any type, for example as memory card, memory stick, CD or DVD, in particular, for example, as an SD card or micro SD card.

As mentioned, the receiving duct is surrounded at least partially by a grip cavity on the outer side of the housing, which grip cavity is designed as a hollow recess with respect to the outer contour of the housing. The grip cavity thus enables simple and ergonomic removal of the electronic data storage means from the receiving duct.

The electrical device can have one or more electric light sources. In addition, a plurality of light exit openings may be present, in particular a particular pattern or a particular arrangement of light exit openings within the grip cavity.

By way of example, the present operating state of the electronic data storage means can be indicated using the light signals output by the electric light source, for example whether or not there is data on the data storage means, whether or not the data storage means is correctly inserted into the receiving duct, or the performance of read and/or write accesses on the data storage means, for example read and/or write accesses by an electronic circuit arranged in the housing of the electrical device. In this way, for example, an access indicator can be realized for the electronic data storage means. According to an advantageous development of the invention, provision is therefore made for the electrical device to have a controller which is set up to automatically activate the electric light source on the basis of an operating state of the electronic data storage means. In particular, the controller can be set up to automatically activate the electric light source on the basis of an access of an electronic circuit arranged in the housing of the electrical device to the electronic data storage means, in particular in the form of an automatic access indicator for the electronic data storage means. The access may be, for example, a read and/or write access to the electronic data storage means inserted into the receiving duct.

According to an advantageous development of the invention, the electric light source is arranged fully or at least partially within the housing of the electrical device. In this way, the electric light source is accommodated in a manner protected by the housing. In addition, the electric light source may expediently be produced, for example, as a modular unit with an electrical printed circuit board which is located within the electrical device. In this case, no special cabling is to be produced for the electric light source.

According to an advantageous development of the invention, the electric light source is not visible or at least partially not visible outside of the housing. This makes it possible to arrange the electric light source, for example, not directly at the light exit opening but somewhat removed therefrom, for example to install the electric light source directly on an electrical printed circuit board. Thus, the arrangement composed of electric light source and light exit opening can be designed, in particular, in the form of an indirect illumination means. As a result of this, an undesired dazzling effect, which could occur by direct irradiation of the light from the electric light source, is avoided. Certain special illumination effects, for example artistic/creative effects, can also be achieved using such indirect illumination.

According to an advantageous development of the invention, the light output by the electric light source is visible outside of the housing in the grip cavity. Thus, the grip cavity can fully or partially light up owing to the light output by the electric light source. According to a development, the grip cavity can have a patterned surface or coating by which the light visible in grip cavity and output by the electric light source is optically influenced, for example a type of mirror coating can be arranged in the grip cavity in order to amplify the lighting effect or a reflection-minimizing shield in order to limit the lighting effect.

According to an advantageous development of the invention, the light exit opening is designed to be open, for example in the form of an aperture in a region of the housing wall having the grip cavity, and/or designed with an at least partially transparent cover. The at least partially transparent cover, which may also be completely transparent, can be clear or tinted in order to achieve a color filter effect.

According to an advantageous development of the invention, the housing of the electrical device is substantially non-transparent. Thus, the housing of the electrical device can be produced, for example, from substantially non-transparent material, for example a plastics material, or can be provided with a non-transparent coating.

According to an advantageous development of the invention, the electric light source is designed as a light-emitting diode. The light-emitting diode may be a single-color light-emitting diode or a multi-color light-emitting diode. The electric light source may also be formed from a plurality of light-emitting diodes which are the same color or are different colors.

According to an advantageous development of the invention, the electric light source is electrically connected to a printed circuit board, which is located in the housing of the electrical device, and/or mechanically mounted on the electrical printed circuit board. This enables a simple and cost-effective manufacture of the electrical device. Thus, the electric light source can in particular be already installed on the electrical printed circuit board during the production or population thereof. The finished printed circuit board with the electric light source is then inserted into the housing. Special mounting of the electric light source on a wall of the housing is then not necessary.

According to an advantageous development of the invention, the grip cavity has a rounded or substantially circular outer contour in plan view of the side of the housing of the electrical device having the grip cavity. This connects a simple and rational producibility of the housing of the electrical device with comfortable haptics and ergonomics when using the electrical device, in particular when inserting the electronic data storage means into the receiving duct and when removing the data storage means.

The receiving duct can be designed, for example, in the form of a slit if a memory card or another relatively thin data storage means is intended to be inserted as electronic data storage means. Electrical contact-making means, for example in the form of sprung contacts or plug-in contacts, are to be arranged in the region of the receiving duct, which contact-making means are electrically connected to electrical components arranged in the electrical device, with the result that the production of an electrical connection of connection contacts of the electronic data storage means to the electrical components arranged in the electrical device is ensured in a simple manner. Thus, the electronic data storage means can be inserted into the receiving duct and taken out of said receiving duct again at any time, in particular arbitrarily according to the choice of the user.

According to an advantageous development of the invention, a light exit duct is arranged within the grip cavity, which light exit duct is designed as another hollow recess with respect to the surface of the grip cavity. The light exit opening is arranged in the region of the light exit duct. Owing to such a light exit duct which stretches even further into the interior of the housing of the electrical device, further degrees of freedom are possible when arranging the electric light source in the electrical device and when generating particular light effects. Thus, for example, a desired indirect illumination can be improved even further. In particular, the light exit duct can also be designed as light exit opening.

According to an advantageous development of the invention, the light exit duct has an outer contour which is substantially in the form of a circular section or is rectangular or round in plan view of the side of the housing having the grip cavity. Other shapes are also advantageously possible, for instance square or other four-sided or polygonal outer contours, optionally with rounded corners.

According to an advantageous development of the invention, the light exit opening is arranged in the region of a wall of the housing and/or of the light exit duct, which is arranged substantially parallel to the insertion plane of the electronic data storage means in the receiving duct. This has the advantage of enabling light from light signals of the electric light source to exit substantially perpendicularly with respect to the housing surface, at least in the region around the light exit opening. This also supports formation of an indirect illumination means. Thus, the light exit opening can be arranged, in particular, in a region of the wall of the housing, which wall forms the grip cavity and/or the light exit duct or at least a part thereof.

According to an advantageous development of the invention, the electrical device has at least one locking means arranged in the region of the receiving duct, by means of which an electronic data storage means placed into the receiving duct can be secured against unauthorized removal. The locking means or optionally plurality of locking means can in particular be configured such that they can interact with a lock or a security tag in order to prevent unauthorized removal of the electronic data storage means or at least to make removal more difficult or in order to make such unauthorized removal identifiable. In this way, undesired manipulation of the electrical device and/or of the electronic data storage means can be counteracted.

According to an advantageous development of the invention, the at least one locking means is arranged outside of the grip cavity. This has the advantage that the locking means can be used in a simple and ergonomic manner and the ergonomics and haptics of the grip cavity when inserting and removing the electronic data storage means are not disturbed by the at least one locking means.

According to an advantageous development of the invention, the grip cavity and the receiving duct, and optionally also the electric light source, are designed in the form of a common data storage means receiving module. In this case, the data storage means receiving module can be designed to be in one piece or as an assembly composed of a plurality of components. This facilitates the production and assembly of the electrical device, both in terms of time and in terms of costs.

The invention is explained in more detail below on the basis of exemplary embodiments with reference to drawings, in which.

The figures show the electrical device or details thereof in each case in isometric views. In the figures, identical reference signs are used for elements which correspond to one another.

Figure 1:
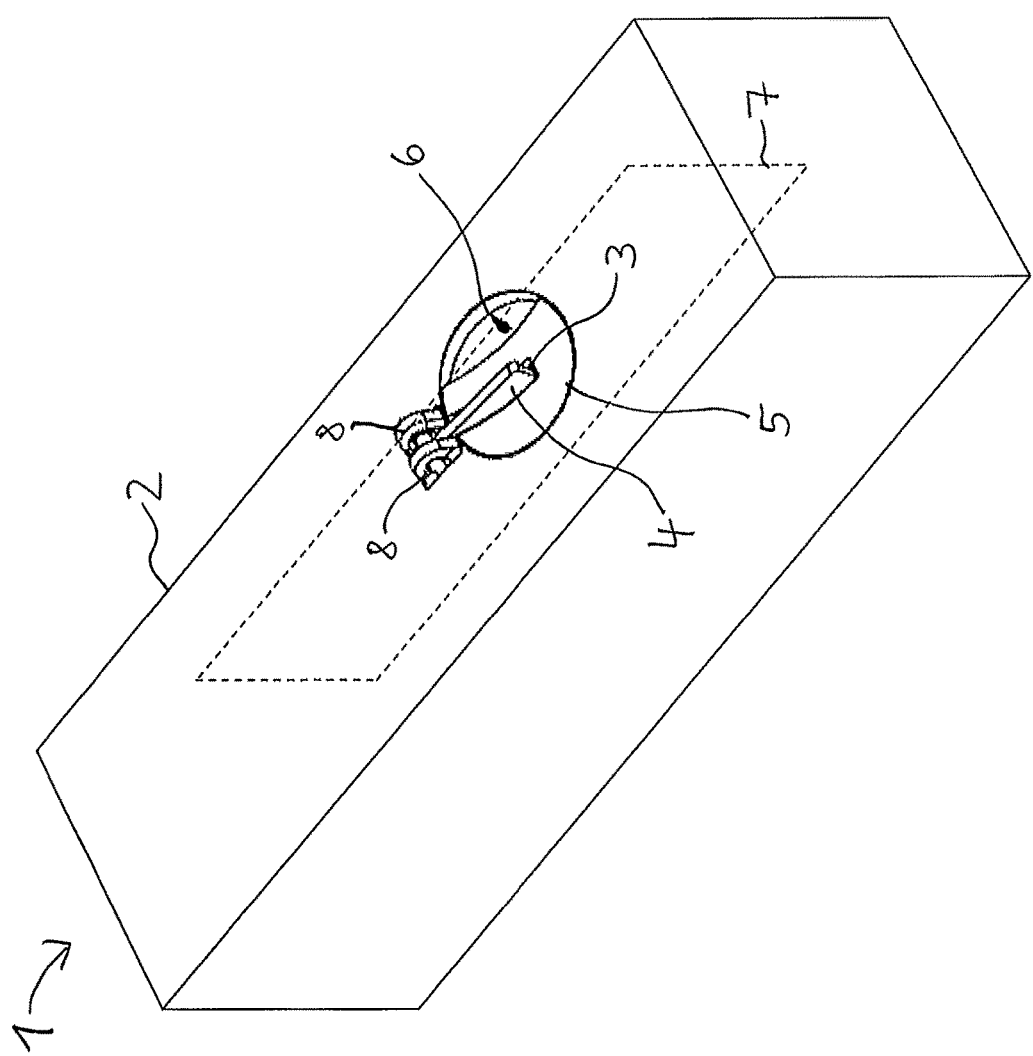
FIG. 1 shows an electrical device.

FIG. 1 shows an electrical device 1, which has a housing 2. An electrical printed circuit board 7 is arranged in the housing 2, which electrical printed circuit board is reproduced with a dashed line as it is not visible from the outside. The electrical and electronic components required for the respective desired function of the electrical device can be found on the electrical printed circuit board 7. In particular, an electronic controller, for example in the form of a transistor circuit, a logic circuit, a microprocessor, a microcontroller or another smart electronic circuit, can be found on the electrical printed circuit board 7. On a side which is accessible from the outer side of the housing 2—on the top in the illustrated example in FIG. 1—there is a receiving duct 3 for an electronic data storage means 4, in this case in the form of a memory card which has already been inserted into the receiving duct 3. Contact is made with the data storage means 4 via electrical contact-making means of the receiving duct 3, which electrical contact-making means can be soldered, for example, to the electrical printed circuit board 7, and the data storage means 4 is connected to components on the printed circuit board 7, for example to the electronic controller.

The receiving duct 3 is at least partially surrounded by a grip cavity 5 on the outer side of the housing 2. Thus, the receiving duct 3, for example, can be arranged somewhat offset from the grip cavity 5—as can be seen in the figures—for example, such that the receiving duct 3 cuts the, for example circular, outer contour of the grip cavity 5. The receiving duct can also be arranged completely within the outer contour of the grip cavity 5. The grip cavity 5 is designed to be depressed with respect to the outer contour of the housing 2. A light exit duct 6 is arranged within the grip cavity 5, which light exit duct extends as further hollow recess even further into the interior of the housing. The light exit duct 6 is designed, in particular, as another hollow recess with respect to the surface of the grip cavity 5. A light exit opening, which is not yet visible in FIG. 1 but which is explained in more detail with reference to the following figures, is arranged within the light exit duct 6 but may also be arranged directly in the grip cavity 5, in particular if no light exit duct 6 is to be provided in other embodiments.

Figure 2:
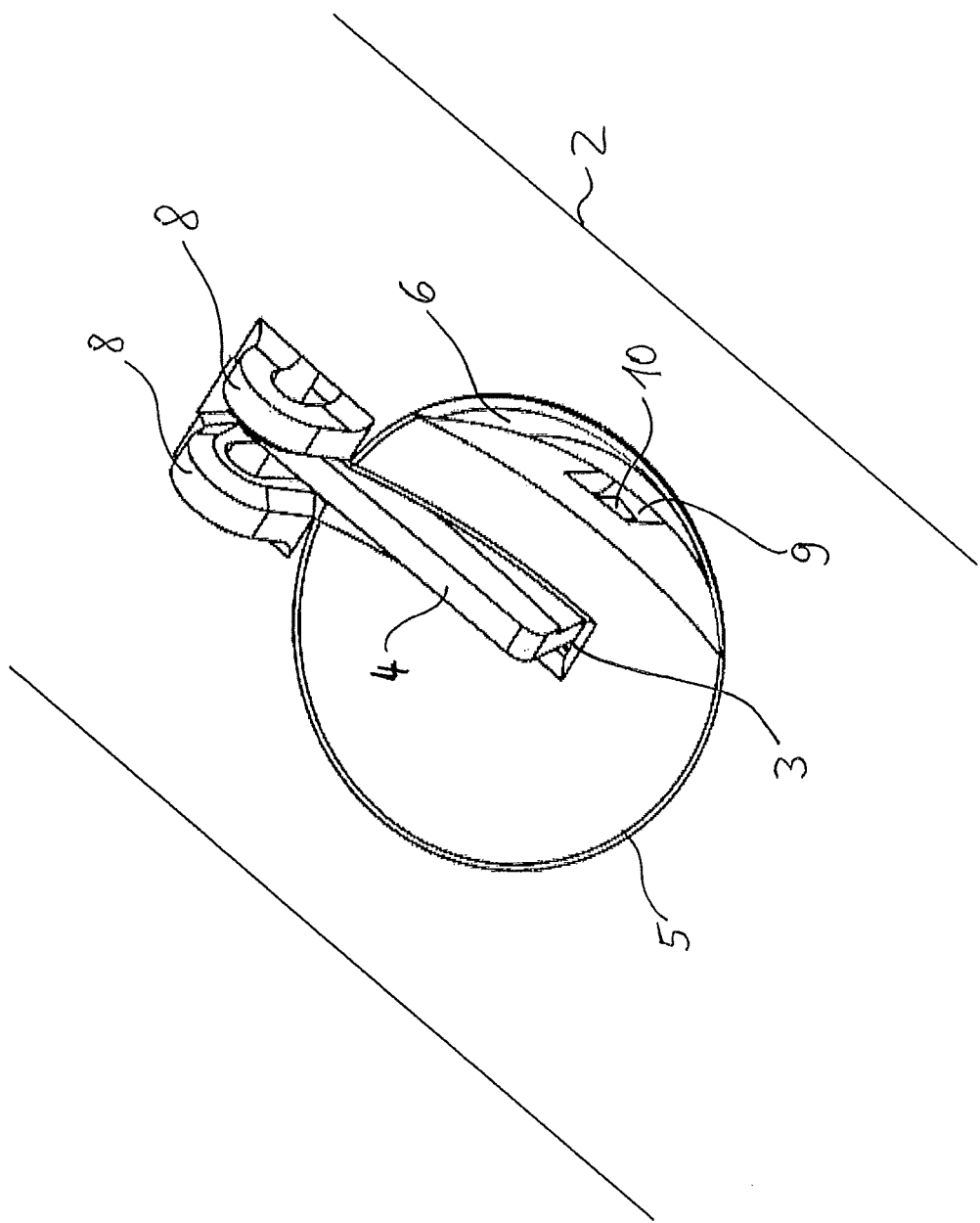
FIG. 2 shows a part of the electrical device according to FIG. 1 in detail.

FIG. 2 shows a view of the top of the housing 2 from another viewing direction, in which an oblique view from above into the light exit duct 6 is made possible. It can be seen that the light exit duct 6 has a light exit opening 9, for example in the form of an aperture through the material of the light exit duct. In this case the light exit opening 9 is arranged on a side of the light exit duct 6 closest in proximity to the electrical printed circuit board 7. An electric light source 10 is at least partially visible in the light exit opening 9. The electric light source 10 is designed in the form of a light-emitting diode soldered onto the electrical printed circuit board 7, for example in the form of a surface-mounted light-emitting diode (SMD light-emitting diode).

Two arcuately formed locking means 8 are located outside the region of the grip cavity 5, between which locking means a part of the receiving duct 3 runs. Accordingly, the data storage means 4 also extends in a region between the locking means 8. The locking means 8 each have openings through which a lock or a security tag can be guided. In this way, the data storage means 4 can be secured against unauthorized removal.

Figure 3:
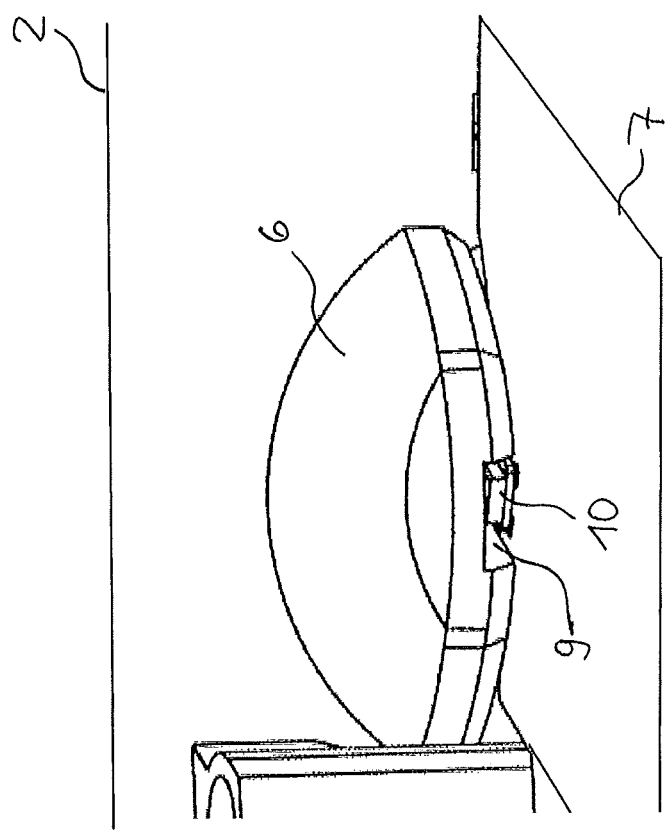
FIG. 3 shows an internal view of a part of the electrical device according to FIG. 1.

FIG. 3 shows part of the electrical device 1 from the inside of the housing 2 and, more precisely, with a view of a detail of the electrical printed circuit board 7 and of the light exit duct 6. The electric light source 10, which is arranged using SMD technology on the printed circuit board 7 and is located in the region of the light exit opening 9, can be seen.

Figure 4:
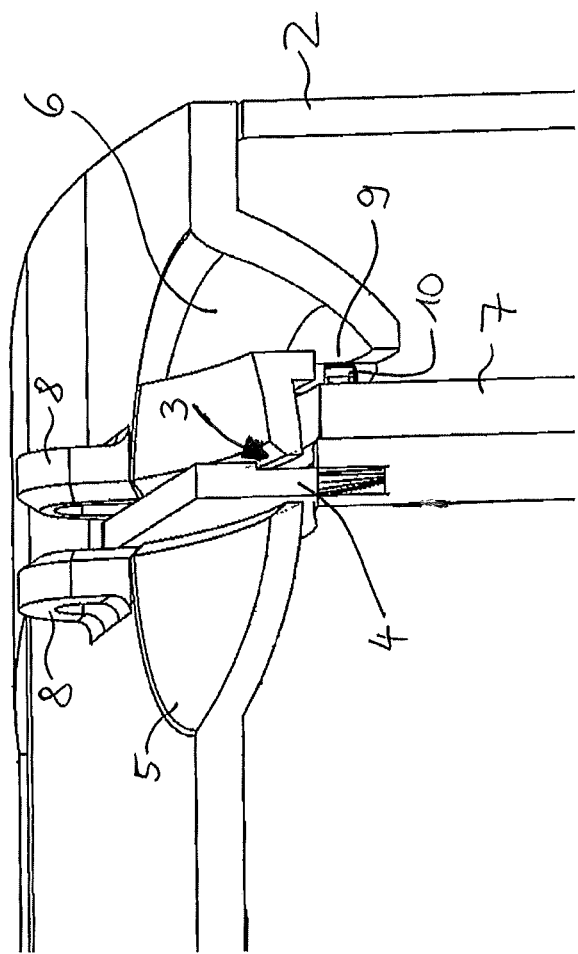
FIG. 4 shows a sectional view of the electrical device according to FIG. 1, and FIGS. 5 to 8 show illustrations of further embodiments of an electrical device in detail.

FIG. 4 shows another view of the parts which have already been explained above of the electrical device in the region of the receiving duct 3 in a sectional illustration of the electrical device 1. The electric light source 10 which is mounted on one side of the electrical printed circuit board 7 in the region of the light exit duct 9 can be seen. The receiving duct 3 or the electrical contact-making means thereof is located on the opposite side of the electrical printed circuit board 7 and can likewise be directly soldered thereto. The receiving duct 3 has at least the slot-shaped opening in the housing 2, through which the data storage means 4 can be inserted. The receiving duct 3 can additionally have, for example, a card holder, for example in the form of an SD card holder.

Figure 5:
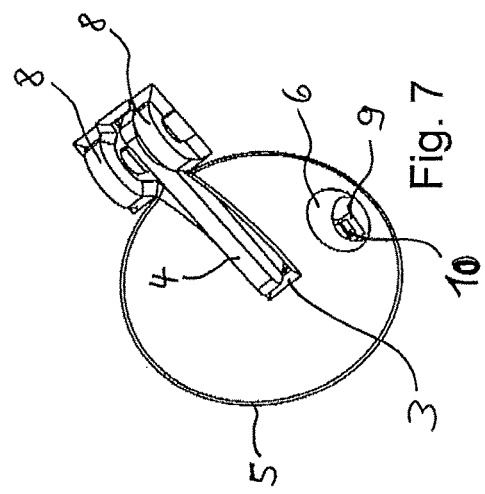
Figure 6:
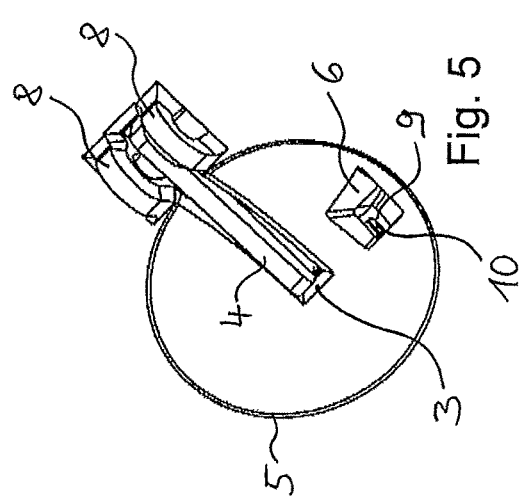

FIGS. 5 and 6 show a second embodiment of the electrical device, in which a light exit duct 6 is again arranged in the region of the grip cavity 5. In this connection, the light exit duct 6 has a rectangular outer contour, optionally with slightly rounded corners, in plan view of the top of the housing 2. The light exit duct 6 can taper towards the housing interior, for example frustopyramidally. FIG. 5 shows said embodiment in a view comparable to that in FIG. 2; FIG. 6 shows it in a view comparable to that in FIG. 3.

Figure 7:
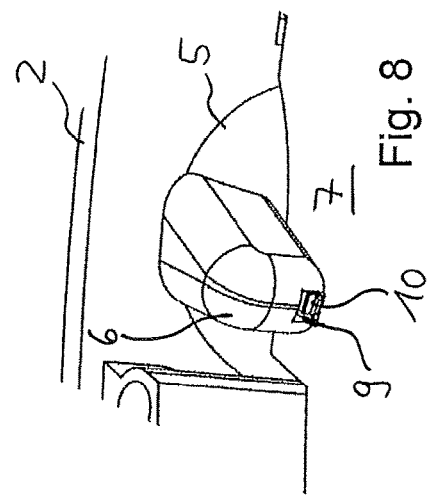
Figure 8:
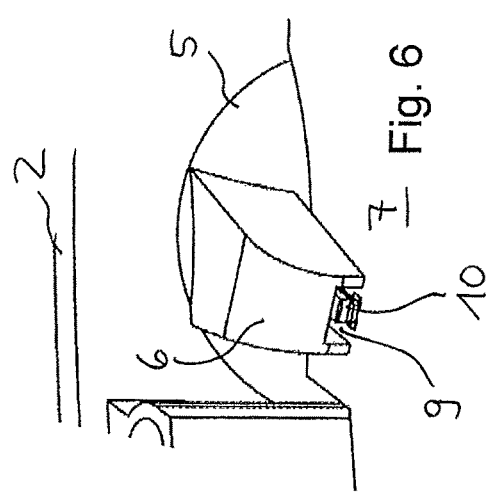

FIGS. 7 and 8 show a second embodiment of the electrical device, in which a light exit duct 6 is again arranged in the region of the grip cavity 5. In this connection, the light exit duct 6 has a circular or oval outer contour in plan view of the top of the housing 2. The light exit duct 6 can likewise taper towards the housing interior, for example frustoconically. FIG. 7 shows said embodiment in a view comparable to that in FIG. 2; FIG. 8 shows it in a view comparable to that in FIG. 3.

As can be seen, modified configurations of the grip cavity, of the receiving duct and, in particular, of the arrangement thereof, of the light exit opening and/or of the light exit duct are also advantageously possible.

The invention claimed is:

1. An electrical device, comprising:
   a housing; and
   at least one receiving duct, which is accessible from an outer side of the housing, for an electronic data storage means which can be inserted into the receiving duct and, as a result, can make contact with electrical components arranged in the electrical device and optionally can be removed again from the receiving duct,
   wherein the receiving duct is surrounded at least partially by a grip cavity on the outer side of the housing, which grip cavity is designed as a hollow recess with respect to the outer contour of the housing,
   wherein at least one light exit opening for light output by at least one electric light source of the electrical device is arranged within the grip cavity, and
   wherein a light exit duct is arranged within the grip cavity, which light exit duct is designed as another hollow recess with respect to the surface of the grip cavity, the light exit duct being defined by a wall of the housing extending from the grip cavity and further into a more interior portion of the housing relative to the grip cavity, the light exit duct being open through the grip cavity to a region outside of the housing, wherein the light exit opening is arranged in the wall of the housing that defines of the light exit duct.

2. The electrical device as claimed in claim 1, wherein the electric light source is arranged fully or at least partially within the housing of the electrical device.

3. The electrical device as claimed in claim 1, wherein the electric light source itself is not visible or at least partially not visible outside of the housing.

4. The electrical device as claimed in claim 1, wherein the arrangement composed of electric light source and light exit opening is designed in the form of an indirect illumination means.

5. The electrical device as claimed in claim 1, wherein the light output by the electric light source is visible outside of the housing in the grip cavity.

6. The electrical device as claimed in claim 1, wherein the light exit opening is at least one of designed to be open or with an at least partially transparent cover.

7. The electrical device as claimed in claim 1, wherein the housing of the electrical device is substantially non-transparent.

8. The electrical device as claimed in claim 1, wherein the electric light source is designed as a light-emitting diode or has a light-emitting diode.

9. The electrical device as claimed in claim 1, wherein the electric light source is at least one of electrically connected to an electrical printed circuit board which is located in the housing of the electrical device, or is mechanically mounted on the electrical printed circuit board.

10. The electrical device as claimed in claim 1, wherein the grip cavity has a rounded or substantially circular outer contour in plan view of the side of the housing of the electrical device having the grip cavity.

11. The electrical device as claimed in claim 1, wherein the light exit duct has an outer contour which is substantially in the form of a circular section or is rectangular or round in plan view of the side of the housing having the grip cavity.

12. The electrical device as claimed in claim 1, wherein the light exit opening is at least one of arranged in a region of a wall of the housing or of the light exit duct, which is arranged substantially parallel to the insertion plane of the electronic data storage means in the receiving duct.

13. The electrical device as claimed in claim 1, wherein the electrical device has a controller, which is set up to automatically activate the electric light source on the basis of an operating state of the electronic data storage means, in particular in the form of an automatic access indicator for the electronic data storage means.

14. The electrical device as claimed in claim 1, wherein the electrical device has at least one locking means arranged in the region of the receiving duct, by means of which an electronic data storage means placed into the receiving duct can be secured against unauthorized removal.

15. The electrical device as claimed in claim 14, wherein the at least one locking means is arranged outside of the grip cavity.

16. The electrical device as claimed in claim 14, wherein the grip cavity and the receiving duct, and optionally also the electric light source, are designed in the form of a common data storage means receiving module.

* * * * *